United States Patent
Aoki et al.

[11] Patent Number: 5,771,268
[45] Date of Patent: Jun. 23, 1998

[54] HIGH SPEED ROTATOR WITH ARRAY METHOD

[75] Inventors: Naoaki Aoki, Austin; Osamu Takahashi, Round Rock; Joel Abraham Silberman; Sang Hoo Dhong, both of Austin, all of Tex.

[73] Assignee: International Business Machines Corporation, Armonk, N.Y.

[21] Appl. No.: 762,910

[22] Filed: Dec. 10, 1996

[51] Int. Cl.$^6$ .................................................. G11C 19/00
[52] U.S. Cl. ............................... 377/77; 377/67; 377/69; 377/75; 365/52; 365/63
[58] Field of Search .................................. 377/67, 69, 75, 377/77, 79–80, 26, 57; 365/52, 63, 205

[56] References Cited

U.S. PATENT DOCUMENTS

| | | |
|---|---|---|
| 4,962,500 | 10/1990 | Nakagawa ............................ 371/24 |
| 4,972,105 | 11/1990 | Burton et al. ........................... 307/468 |
| 5,003,202 | 3/1991 | Keida ..................................... 307/465 |
| 5,221,867 | 6/1993 | Mitra et al. ............................ 307/465 |
| 5,317,540 | 5/1994 | Furuyama .......................... 365/230.01 |
| 5,398,198 | 3/1995 | Mahant-Shetti et al. ............... 364/716 |
| 5,663,923 | 9/1997 | Baltar et al. ............................. 365/52 |
| 5,691,933 | 11/1997 | Takenaka .................................. 365/63 |

*Primary Examiner*—Margaret Rose Wambach
*Attorney, Agent, or Firm*—Sawyer & Associates; Casimer K. Salys

[57] ABSTRACT

A high-speed rotator array for shifting input data a specified amount. The rotator array includes a plurality of straight shift control lines extending across the array for receiving shift data representative of shift values, and a plurality of input terminals for receiving input data to be shifted. The rotator array also includes a plurality of data lines coupled to the plurality of input terminals that extend both diagonally and horizontally across the array. In response to the rotator array receiving the shift data and the input data, a plurality of output terminals transmit the shifted output data.

12 Claims, 4 Drawing Sheets

$B_0 = R_{63}A_{63} + R_{62}A_{62} + R_{61}A_{61} + \ldots + R_2A_2 + R_1A_1 + R_0A_0$ $B_1 = R_{63}A_0 + R_{62}A_{63} + R_{61}A_{62} + \ldots + R_2A_3 + R_1A_2 + R_0A_1$ $B_2 = R_{63}A_1 + R_{62}A_0 + R_{61}A_{63} + \ldots + R_2A_4 + R_1A_3 + R_0A_2$

· · · ·

$B_{62} = R_{63}A_{61} + R_{62}A_{60} + R_{61}A_{59} + \ldots + R_2A_0 + R_1A_{63} + R_0A_{62}$ $B_{63} = R_{63}A_{62} + R_{62}A_{61} + R_{61}A_{60} + \ldots + R_2A_1 + R_1A_0 + R_0A_{63}$

FIG. 4

HIGH SPEED ROTATOR WITH ARRAY METHOD

TECHNICAL FIELD

This patent application relates to logic circuits, and more particularly to a data rotator for shifting input data by a selected number of bits.

BACKGROUND

One important function performed by unit within a microprocessor is a shift function. Two types of function units called a multiplexer-based shifter and a barrel shifter are used to perform a rapid shift of an input data by a selected number of bits. Traditional multiplexer-based shifters comprise a plurality of gates that includes at least one transistor arranged in matrix. Horizontal data signal lines form the rows of the matrix. Input data terminals are connected to one end of the data signal lines for receiving each bit of information of the input data, while output terminals are connected to the other end of the data signal lines. Shift control lines which form the columns of the matrix, are each connected in some manner to the gates. Each gate is connected to at least one of the shift control lines and to at least one of the data lines. Shift amount signals representing how many bits the input data will be shifted are selectively applied to the transistors via the shift control lines, and the shifted data is transmitted out of the output terminals.

Although conventional shifters effectively supply shifted data, they suffer from several disadvantages due to the nature of their design. For example, there has been an increasing demand for higher speed for each function unit in a microprocessor that has yet to be met with conventional shifters. In a multiplexer-based shifter, for instance, each bit of the input data is required to pass through the gates even when the data is not being shifted. For large shifts, such as a shift of sixty-three bits, each bit must pass through six gates, resulting in poor performance.

In a traditional barrel shifter, shift control lines are connected diagonally to transistors in a matrix in a stair-step pattern. This increases both the length of the shift control lines and the area of the barrel shifter. And since the shift amount signals are delivered to the transistors, the shift control lines are usually made of polisilicon which has a larger resistance than metal wires, and therefore slower performance.

Accordingly, what is needed is an improved shifter for a microprocessor that requires a small area, while providing high-performance. The present invention addresses such a need.

SUMMARY

The present invention is a method and system for providing a high-speed rotator array. The rotator array includes a plurality of straight shift control lines extending across the array for receiving shift data representing shift values, and a plurality of input terminals for receiving input data to be shifted. The rotator array also includes a plurality of data lines coupled to the plurality of input terminals that extend both diagonally and horizontally across the array. In response to receiving the shift data and the input data, a plurality of output terminals transmit the shifted output data.

According to the method and system disclosed herein, the straight shift control lines enable a reduction in line length, which increases the speed of the circuitry and reduces the area of the rotator. In another aspect of the present invention, each column of the array includes a pair of bit-lines and a sense amplifier for sensing the shifted output data. The use of sense amplifiers to sense shifted output data is faster than the use of data lines to transmit the shifted output data, and the rotation speed is the same for all shift functions.

BRIEF DESCRIPTION OF THE DRAWINGS

FIG. 4 is a table showing equations for producing the sixty-four bit shifted output data from the rotator array in accordance with the present invention.

DETAILED DESCRIPTION

The illustrative embodiment relates to an improvement in barrel shifter circuits. The following description is presented to enable one of ordinary skill in the art to make and use the illustrative embodiment and is provided in the context of a patent application and its requirements. Various modifications to the illustrative embodiment will be readily apparent to those skilled in the art and the generic principles herein may be applied to other embodiments. Thus, the illustrative embodiment is not intended to be limited to the embodiment shown but is to be accorded the widest scope consistent with the principles and features described herein.

Figure 1:
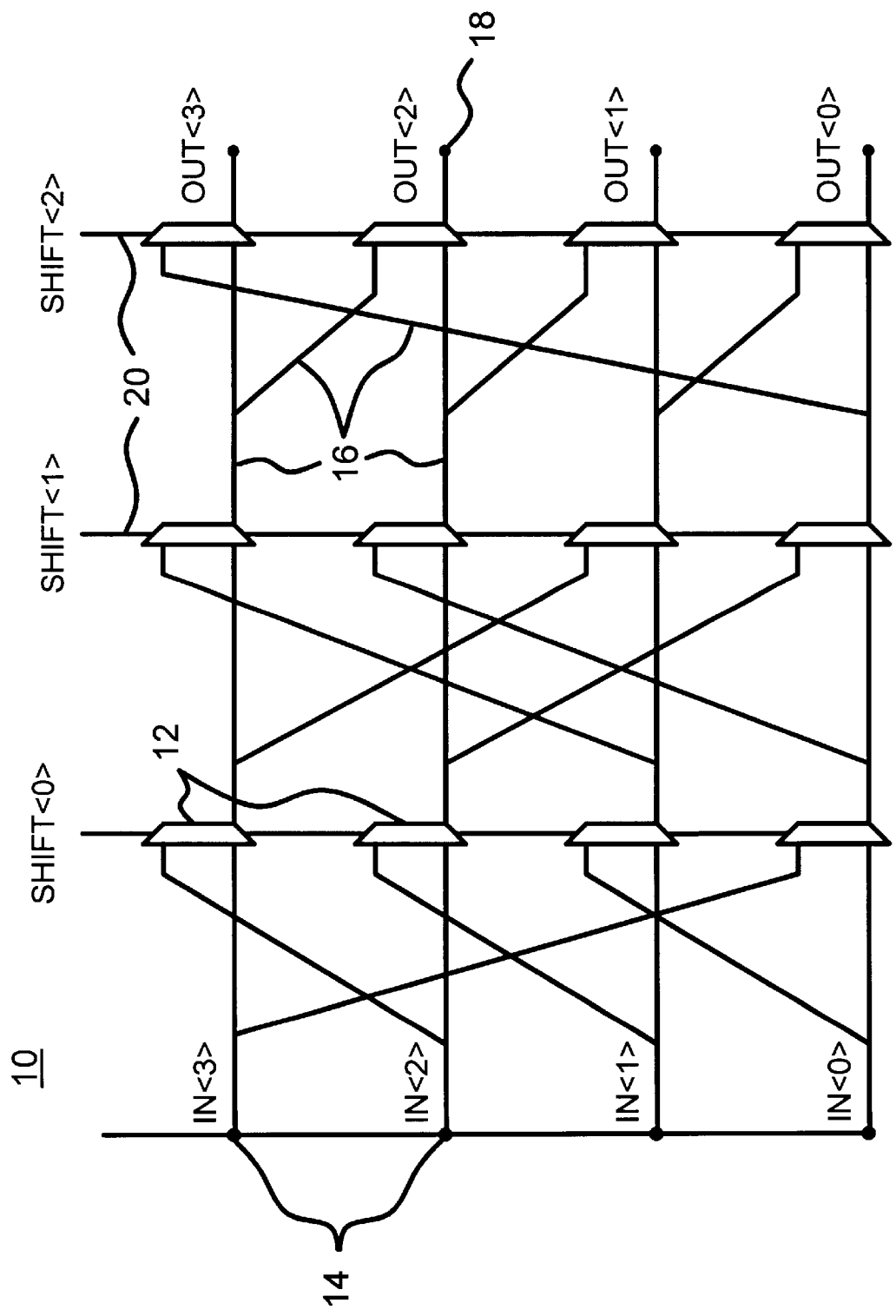
FIG. 1 is a block diagram of a conventional 4-bit multiplexer-based shifter.

FIG. 1 is a block diagram of a conventional 4-bit multiplexer-based shifter 10. The multiplexer-based shifter 10 comprises a plurality of gates 12 arranged in matrix, where each of the gates 12 include a plurality of transistors (not shown). Input terminals 14 (IN<0>, IN<1>, ... IN<3>) are connected to one end of data signal lines 16 for receiving respective bits of the input data, and output terminals 18 (OUT<0>, OUT<1>, ... OUT<3>) are connected to the other end of the data signal lines 16. Shift control lines 20 (shift<0>, ... shift<3>) are each vertically connected to the gates 12 in each respective column of the matrix. As shown, each gate 12 in a row is connected to the corresponding data signal line 16 in that row and to a data signal line 16 in another row via diagonal data signal lines 16.

Shift amount signals representing how many bits the input data will be shifted are selectively applied to the gates 12 via the shift control lines 20. The shift<0> signal represents a shift by zero or one bit, depending on whether the signal is high or low; the shift<1> signal represents a shift by zero or two bits, depending on whether the signal is high or low; and the shift<2> signal represents a shift by zero or four bits, depending on whether the signal is high or low.

Intermediate shift amounts may be obtained through combinations of the shift amount signals. For example, a shift of three bits is obtained by applying shift<0>and shift<1>. This results in the bit input at IN<3> to be output at OUT<0>, the bit input IN<2> to be output at OUT<3>, the bit input at IN<1> to be output at OUT<2>, and the bit input at IN<0> to be output at OUT<1>.

In the multiplexer-based shifter 10 of FIG. 1, each bit of the input data must pass through the gates 12 in the matrix even when the data is not being shifted (i.e. shift<0>). For large shifts, such as a shift of sixty-three bits, each bit must therefore pass through 6 gates[12], resulting in poor performance.

Figure 2:
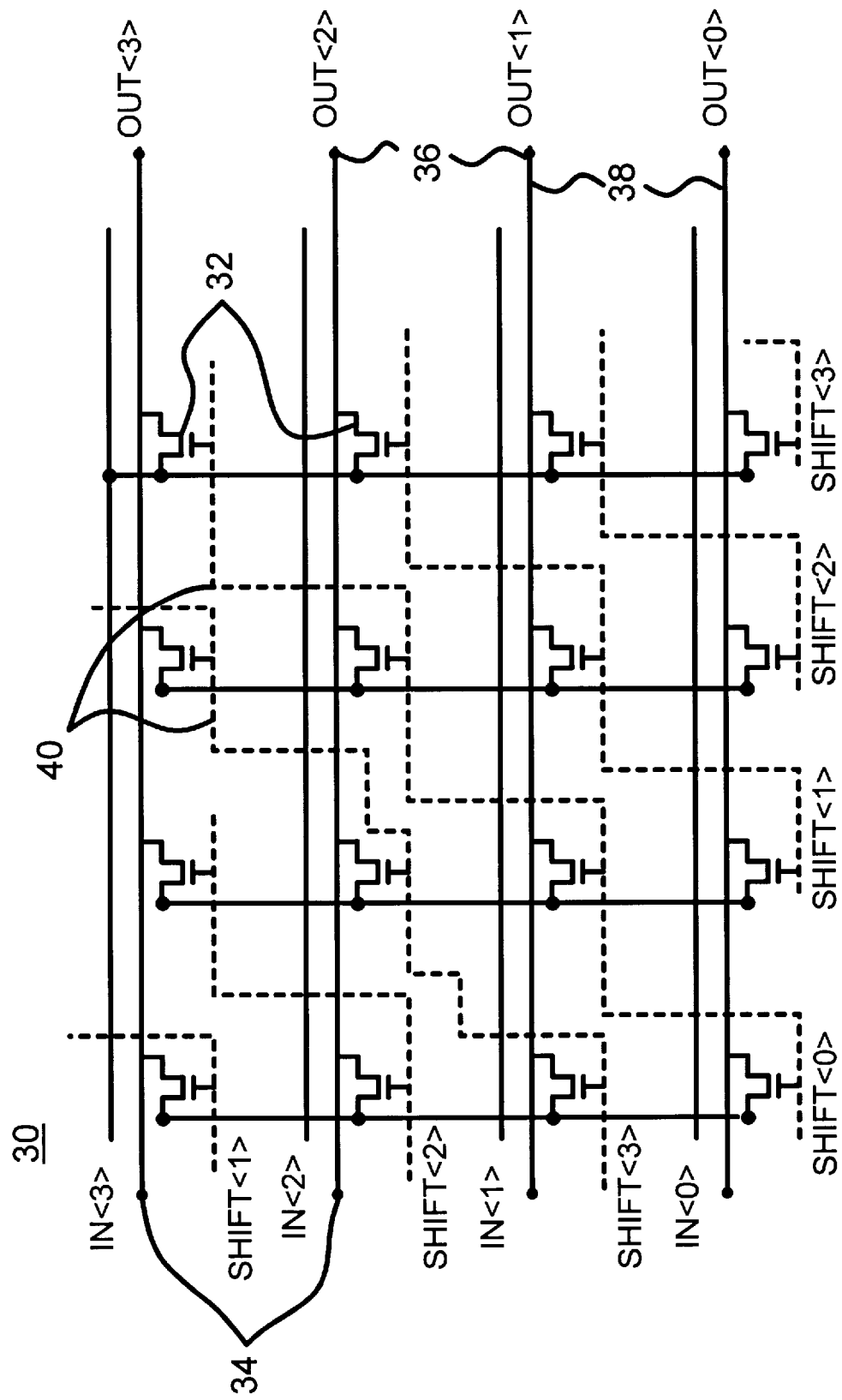
FIG. 2 is a block diagram of a conventional 4-bit barrel shifter.

FIG. 2 is a block diagram of a conventional 4-bit barrel shifter 30. As in the multiplexer-based shifter of FIG. 1, the barrel shifter 30 includes a matrix of transistors 32, input terminals 34 (IN<0>, IN<1>, . . . IN<3>) and output terminals 36 (OUT<0>, OUT<1>, . . . OUT<3>), which are connected to data input lines 38, and shift control lines 40 (shift<0>, . . . shift<3>). The source-drain path of each transistor 32 is connected between one of the input terminals 34 and one of the output terminals 36.

The shift amount signals are selectively applied to the gates of the transistors 32 via the shift control lines 40, which are diagonally routed to the transistors 32 in the matrix via step-wise lines. As shown, routing the shift control lines 40 to the transistors 32 using step-wise lines increases the length of the lines. Since the shift amount signals need to be delivered to the gates of transistors 32, the shift control lines 40 are polisilicon, which have larger resistance than metal wires. The longer length and larger resistance of the shift control lines 40 slows the overall performance of the barrel shifter 30.

Figure 3:
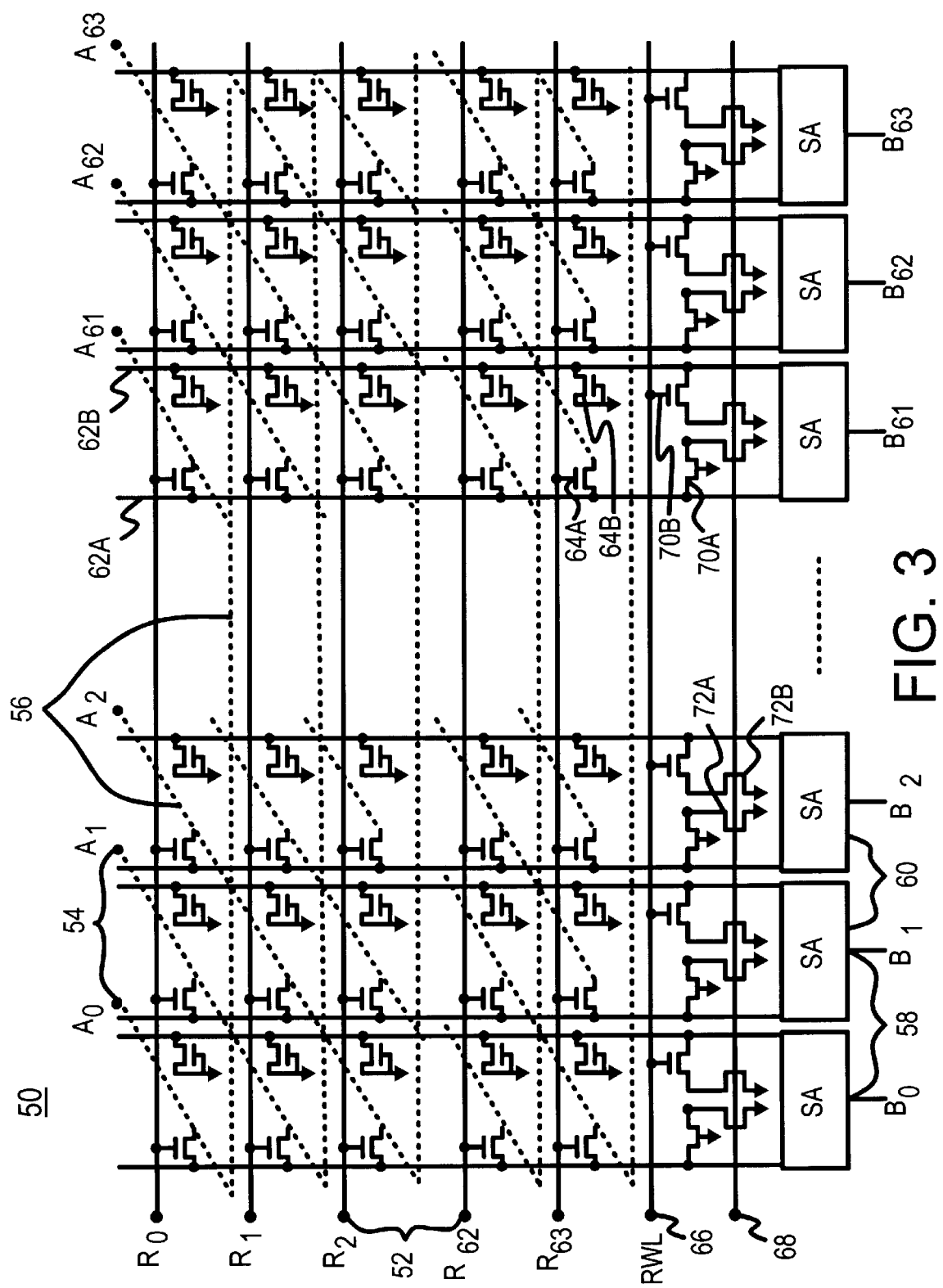
FIG. 3 is a block diagram illustrating a sixty-four bit high-speed rotator array in accordance with the present invention.

The present invention provides an improved shifter, referred to herein as a rotator array circuit, which is high-performance while requiring a small area, as shown with reference to FIG. 3.

FIG. 3 is a block diagram illustrating a sixty-four bit high-speed rotator array 50 in accordance with the present invention. The rotator array 50 includes a plurality of shift control lines 52 (R0, R1, . . . , R63), a plurality of data lines 56 (shown by dashed lines) coupled to the input terminal 54 (A0, A1, . . . , A63), and a plurality of output terminals 58 (B0, B1, . . . , B63) coupled to a respective sense amplifier 60.

The rotator array 50 performs the overall function of a shifter, but the function is implemented differently. For example, the rotary array 50 performs a two bit shift by activating the R2 shift control line 52, causing input data A0 to be output at B62, A1 to be output at B63, A2 to be output at B0, and so on; however, the shift function is implemented with an improved array architecture.

In one aspect of the present invention, the rotator array 50 transmits shift amount signals along the rows of the array 50 through straight shift control lines 52, rather than diagonal shift control lines. As shown, the straight shift control lines 52 form the rows of the array. The rotator array 50 transmits input data from the input terminals 54 via data lines 56 that are routed both diagonally and horizontally across the array 50, as explained further below.

In another aspect of the present invention, shifted output data is produced from each column in the array 50 by a pair of bit-lines 62 (bit-line true 62a and bit-line complement 62b) that are coupled to a sense amplifier 60.

In each row and column intersection in the array, a primary transistor 64a is coupled between the shift control line 52 in the row, the bit-line true 62a in the column, and one of the diagonal data lines 56. A dummy transistor 64b is connected between ground and the corresponding bit-line complement 62b to balance the primary transistor 64a. The last row in the array comprises a reference word line (RWL) 66 and a bias line 68, a pair of reference transistors (dummy reference transistor 70a and reference transistor 70b), and a pair of bias transistors (dummy bias transistor 72a and bias transistor 72b). The RWL 66 is coupled to each of the complement bit-lines 62b through the reference transistors 70b.

In operation, one of the shift control lines 52 corresponding to the amount of the shift operation is activated, which causes all of the primary transistors 64a in that row to activate. For example, during a shift one function, R1 activates, causing the primary transistors 64 in row one to activate. At the same time, each bit of input data is transmitted to a respective primary transistor 64a via the diagonal input lines 56. Referring again to the example, A1 is transmitted to the primary transistor 64a in row 1 column 0.

After the input data is received and the shift amount signals are selectively applied, the RWL 66 creates a voltage difference between each pair of bit-lines 64. The purpose of the reference transistor 70b is to generate the necessary voltage difference for the sense amplifier 60 between bit-line true 62a and bit-line compliment 62b. The size of the reference transistor 70b and the bias transistor 72b is designed to reduce the fall speed of the bit-line compliment 62b. That is, the fall speed of the bit-line compliment 62b is reduced to half of the fall speed of the bit-line true 62a, with only one primary transistor 64a in a column being turned on and with the input data, which goes through the turned-on transistor, being logic zero.

The dummy reference transistor 70a, which is connected to bit-line true 62a, is always turned-off. The purposes of the dummy reference transistor 70a and the dummy bias transistor 72a are to balance the node capacitance between the bit-line true 62a and the bit-line compliment 62b. In the case where the data value which passed from input to the bit-line true 62a is logic one, the voltage difference between the bit-line true 62a and the bit-line compliment 62b becomes positive. In the case where the data value which passed from input to the bit-line true 62a is logic zero, the voltage difference between the bit-line true 62a and the bit-line compliment 62b becomes negative.

In this manner, the sense amplifier 60 can detect the voltage difference between the bit-line true 62a and the bit-line compliment 62b and generate the output 58 in the correct polarity. Since the bit-line compliment 62b falls at half speed of the bit-line true 62a with input data being logic zero, the sense amplifier 60 performance is well balanced to detect both cases.

According to the present invention, the use of sense amplifiers 60 to sense shifted output data is faster than the use of data lines to transmit the shifted output data. Furthermore, the rotation speed is the same for all shift functions.

FIG. 4 is a table showing equations for producing each bit of the shifted output data (B0, B1, . . . ) from the connections between the shift lines (R0, R1, . . . ) and each bit of input data (A0, A1, . . . ). When FIG. 4 is rotated into a landscape orientation, the rows formed by the shift lines (R) and the columns formed by input data (A) and the shifted output data (B), respectively, correspond to the rows and columns of the rotary array 50 in FIG. 3. In any given column of the array (B), the shifted data bit is produced by summing the operands therein.

The dashed lines 56 imposed over the equations represent the routing scheme of the data lines 56 across the rows and columns in the array. In general, the data lines 56 are routed diagonally such that a data line originating in column N of the array 50 is coupled to the transistors located in column zero, row N, of the array 50. The data lines 56 are then routed horizontally from column zero to the last column in the array 50. From the last column, each of data lines 56 is again routed diagonally such that a data line extending horizontally in row M of the array 50 terminates in column M+1 of the array 50.

Transmitting shift amount signals through straight control lines 52 while transmitting input data through diagonal data lines 56 in accordance with the present invention is in contrast to conventional barrel shifters, which use diagonal shift control lines to transmit the shift amount signals and straight lines to transmit the input data. The straight routing of the rotate amount signals enables the reduction of line length, therefore, the parasitic resistance of the lines. This leads to an increase in the speed of the circuitry and the area reduction of driver units. Routing input data via diagonal data lines 56 does not result in a performance penalty since the data lines 56 are preferably metal wires. Furthermore, the input data travels through at most one transmission gate.

The resulting structure of the rotator array 50 is highly structured, and can be therefore be fabricated smaller in size compared to conventional barrel shifters. Additional space is required for the sense amplifiers 60 and the complement bit-lines 62b; however, the rotator array 50 still results in high area effectiveness and overall increased performance.

Another advantage of the present invention is the possibility of reducing design time. The array approach of this invention is highly transferable to other function units where some circuits blocks can be shared without significant modification. Although the present invention has been described in terms of a rotator, those with ordinary skill in the art will recognize that the array structure may be used to implement other logic circuits that include arithmetic functions, such as Count-Leading Zeros, Adder, and Compare functions. In addition a read only memory (ROM) can also be implemented using the array structure of the present invention.

A high speed rotator circuit having an array structure has been disclosed. Although the system and method has been described in accordance with the embodiments shown, one of ordinary skill in the art will readily recognize that there could be variations to the embodiments and those variations would be within the spirit and scope of the above-described system and method. Accordingly, many modifications may be made by one of ordinary skill in the art without departing from the spirit and scope of the appended claims.

What is claimed is:

1. A rotator array comprising:
   a plurality of straight shift control lines extending across the array for receiving shift data representative of shift values, the straight shift control lines forming rows of the rotator array;
   a plurality of input terminals for receiving input data to be shifted, the input terminals corresponding to column locations in the array;
   a plurality of data lines coupled to the plurality of input terminals that extend diagonally and horizontally across the array;
   a plurality of primary transistors each located at a row and column intersection, and coupled to the straight shift control line in the corresponding row;
   a pair of bit-lines coupled to each of the primary transistors in a respective column; and
   a sense amplifier coupled between each pair of bit-lines for providing shifted output data in response to receiving the shift data and the input data.

2. A rotator array as in claim 1 wherein the rotator array further includes a plurality of output terminals each coupled to one of the sense amplifiers for transmitting the shifted output data.

3. A rotator array as in claim 2 wherein the data lines are routed diagonally such that a data line originating in column N of the array is coupled to the primary transistors located in column zero, row N, of the array, the data lines then being routed horizontally from column zero to a last column in the array, wherein the data lines are again routed diagonally such that a data line extending horizontally in row M of the array terminates in column M+1 of the array.

4. A rotator array as in claim 3 wherein the rotator array further includes a reference word line coupled to the pairs of bit-lines for generating a voltage difference between the respective bit-lines in each pair of bit-lines.

5. A rotator array as in claim 4 wherein each pair of bit-lines includes a bit-line true and a bit-line complement.

6. A rotator array as in claim 5 wherein the primary transistor and a dummy transistor are connected between the bit-line true and the bit-line complement of each pair of bit-lines across each row in the rotator array.

7. A rotator array as in claim 6 wherein at each row and column intersection in the rotator array, the primary transistor is coupled between the straight shift control line in the row, the bit-line true in the column, and one of the diagonal data lines.

8. A rotator array as in claim 7 wherein the dummy transistor is connected between ground and the corresponding bit-line complement to balance the primary transistor.

9. A method for providing a high-speed rotator array, comprising the steps of:
   a) receiving shift data representative of shift values on a plurality of shift control lines that are routed on straight lines across the array;
   b) receiving input data to be shifted at a plurality of input terminals;
   c) routing a plurality of data lines that are coupled to the plurality of input terminals both diagonally and horizontally across the array;
   d) providing a primary transistor at each row and column intersection in the rotator array;
   e) providing a pair of bit-lines for each column in the array, each pair of bit-lines coupled to each of the primary transistors in the corresponding column; and
   f) providing a sense amplifier for each column in the array, each sense ampliphier coupled to the pair of bit-lines in the corresponding column for providing shifted output data in response to receiving the shift data and the input data.

10. The method of claim 9 wherein the rotator array includes a plurality of rows and columns, the method further including the step of:
   g) transmitting output data from the sense ampliphiers on a plurality of output terminals.

11. The method of claim 9 wherein step c) further includes the steps of:
   c1) routing the data lines diagonally such that a data line originating in column N of the array is coupled to the primary transistor located in column zero, row N, of the array;
   c2) routing the data lines horizontally from column zero to a last column in the array; and
   c3) routing the data lines diagonally from the last column, such that a data line extending horizontally in row M of the array terminates in column M+1 of the array.

12. A rotator array comprising:
   a plurality of straight shift control lines extending across the array for receiving shift data representative of shift values, the straight shift control lines forming rows of the rotator array;
   a plurality of input terminals for receiving input data to be shifted, each of the input terminals corresponding to a column in the array;

a plurality of primary transistors, each located at respective row and column intersection;

a plurality of data lines coupled to the plurality of input terminals, wherein the data lines are routed diagonally such that a data line originating in column N of the array is coupled to the primary transistors located in column zero, row N, of the array, the data lines then being routed horizontally from column zero to a last column in the array, wherein the data lines are again routed diagonally such that a data line extending horizontally in row M of the array terminates in column M+1 of the array;

a plurality of pairs of bit-lines, each pair of bit-lines coupled to the primary transistors in a respective column; and a plurality of sense amplifiers, each of the sense amplifiers coupled to one of the pairs of bit-lines for providing the shifted output data in response to receiving the shift data and the input data.

\* \* \* \* \*

UNITED STATES PATENT AND TRADEMARK OFFICE
CERTIFICATE OF CORRECTION

PATENT NO. : 5,771,268
DATED : June 23, 1998
INVENTOR(S) : Aoki, et. al.

It is certified that error appears in the above-identified patent and that said Letters Patent is hereby corrected as shown below:

Column 6, Line 39: ampliphier should read amplifier.

Column 6, Line 46: ampliphiers should read amplifiers.

Signed and Sealed this

Twenty-ninth Day of September, 1998

Attest:

BRUCE LEHMAN

Attesting Officer                Commissioner of Patents and Trademarks